United States Patent [19]
Elrabaa et al.

[11] Patent Number: 5,966,032
[45] Date of Patent: Oct. 12, 1999

[54] BICMOS TRANSCEIVER (DRIVER AND RECEIVER) FOR GIGAHERTZ OPERATION

[75] Inventors: Muhammad S. Elrabaa, Beaverton, Oreg.; Mohamed I. Elmasry, Waterloo; Duljit S. Malhi, Kanata, both of Canada

[73] Assignee: Northern Telecom Limited, Montreal, Canada

[21] Appl. No.: 08/720,377

[22] Filed: Sep. 27, 1996

[51] Int. Cl.$^6$ ............................................. H03K 19/0175
[52] U.S. Cl. ............................................. 326/84; 326/64
[58] Field of Search ............................. 326/84, 64, 65, 326/66, 67

[56] References Cited

U.S. PATENT DOCUMENTS

| | | | |
|---|---|---|---|
| 4,593,206 | 6/1986 | Neidorff et al. | 326/84 |
| 4,999,519 | 3/1991 | Kitsukawa et al. | 326/84 |
| 5,012,137 | 4/1991 | Muellner | 326/66 |
| 5,023,488 | 6/1991 | Gunning . | |
| 5,363,332 | 11/1994 | Murabayashi et al. | 326/84 |
| 5,528,171 | 6/1996 | Doi et al. | 326/66 |
| 5,561,382 | 10/1996 | Ueda et al. | 326/66 |
| 5,561,388 | 10/1996 | Kumagai | 326/66 |

*Primary Examiner*—Michael J. Tokar
*Assistant Examiner*—Richard Roseen
*Attorney, Agent, or Firm*—Foley & Lardner

[57] ABSTRACT

Several low power, low voltage swing, BiCMOS circuits for used in high speed chip-to-chip communications are described. In particular a BiCMOS low voltage swing transceiver comprising a driver and a receiver with low on-chip power consumption is reported. Operating at 3.3.V, the universal transceiver can drive and receive low voltage swing signals with termination voltages ranging from 5V down to 2V, without using external reference voltages and at frequencies exceeding 1 GHz. On-chip power consumption is much lower than that of known CML/ECL type transceivers having comparable speeds.

19 Claims, 10 Drawing Sheets

FIG. 17

BICMOS TRANSCEIVER (DRIVER AND RECEIVER) FOR GIGAHERTZ OPERATION

FIELD OF THE INVENTION

This invention relates to a BiCMOS transceiver (driver and receiver) for GHz operation.

BACKGROUND OF THE INVENTION

High speed digital telecommunications switches may comprise many interconnected integrated circuit (IC) chips. Chip-to-chip communication is achieved by transceivers, i.e. drivers and receivers, which transmit and receive signals along transmission lines interconnecting the integrated circuit chips. The demand for higher circuit speeds, higher chip-to-chip bit rates, and lower on-chip power consumption places corresponding demands the output drivers/input buffers of the transceivers. Low power consumption is essential to allow system designers to increase the number of I/Os per chip while maintaining high reliability and keeping the total power dissipation within thermal limits.

Bipolar circuits such as ECL (emitter coupled logic) or CML (current mode logic) can meet the speed requirements. ECL is conventionally used for maximum speed, while CML is used for lower power consumption. However, both CML and ECL, when used as drivers, consume large amounts of power, particularly for level shifting/buffering of the input signals, and for the current switch (the tail current). Thus low power consumption is an major concern as the number of I/Os for telecommunications integrated circuits increases.

Various dynamic circuits techniques to reduce power consumption of ECL/CML logic circuits, while maintaining or increasing their speeds, have been reported. However these techniques were intended for bipolar VLSI logic applications, and are not suitable for ECL/CML output driver applications.

Recently many low voltage swing driver circuits have been reported. These circuits range from reduced swing CMOS, CMOS pseudo ECL, or CMOS 100K ECL, and CMOS GTL. CMOS reduced swing transceivers have limited speed. CMOS pseudo ECL or CMOS 100K ECL are complicated and have higher power consumption. For example, CMOS GTL bi-directional transceiver is described in U.S. Pat. No. 5,023,488 to Gunning, entitled "Drivers and receivers for interfacing VLSI CMOS circuits to transmission lines" and requires different reference and termination voltages. Another transceiver having reduced EMI and power dissipation is described in copending U.S. patent application Ser. No. 08/368,945 filed Jan. 5, 1995 to Sasaki et al. entitled "Signal transmitter and transceiver and apparatus incorporating the same". However these receivers, as well as true or pseudo Bipolar ECL or CML transceivers, each require different termination voltages.

Thus, existing low voltage swing transceiver circuits are incompatible with each other due to their different termination/reference voltage requirements. In systems using parts with different transceiver types, signal conversion or interface circuitry, as well as multiple termination and reference voltages are required, which adds to the overall cost and complexity of the system.

Moreover, the Digital Signal Processing (DSP) portions of high speed communications chips are usually implemented using CMOS logic. As future submicron and deep submicron Bipolar CMOS technologies, are scaled down, the supply voltages will be scaled down, to maintain reliability of short channel MOS devices. Since BiCMOS technology combining bipolar and CMOS (complementary metal oxide semiconductor) technology has proven to be an excellent workhorse for telecommunications applications, there is a need for BiCMOS compatible transceivers capable of meeting the requirements mentioned above for high speed chip-to-chip communications.

SUMMARY OF THE INVENTION

Thus the present invention seeks to provide an improved transceiver, comprising driver and receiver circuits, with reduced power consumption and increased speed, which overcome or avoid the above-mentioned problems.

According to one aspect of the present invention there is provided transceiver for high speed chip to chip communications comprising a driver circuit and a receiver circuit, wherein the receiver circuit comprises: an input buffer (UIB); means for generating a reference voltage ($V_{ref}$); and load control means for generating first and second control voltages V1 and V2; the input buffer comprising an emitter coupled differential pair of first and second bipolar junction transistors (BJTs) coupled to a source follower stage comprising a plurality of pairs of PMOS transistors, the PMOS transistors providing a load means; an input signal means and the reference voltage $V_{ref}$ generating means being coupled respectively to the bases of the first and second of BJTs; the load control means being coupled to the gates of the PMOS transistors, for providing first and second control voltages V1 and V2 for biasing corresponding pairs of gates of the PMOS transistor pairs of the load means.

Preferably, N wells of the PMOS load means are coupled to the higher of VT and VDD through another pair of PMOS transistors, also controlled by first and second control voltages V1 and V2.

The receiver can read signals with termination voltages from 1.5 to 5V and there is no need for an external reference voltage.

The means for generating a reference voltage comprises temperature compensation means whereby $V_{ref}$ is independent of VT. Preferably, the reference voltage $V_{ref}$ is held by the $V_{ref}$ generating means at about -0.45V below the termination voltage VT of the transmission line. The load control means, which comprises a source coupled NMOS transistor pair and cross coupled PMOS transistor loads provides first and second control voltages V1 and V2 for biasing the PMOS load devices such that the input BJT pair never saturates.

According to another aspect of the present invention there is provided a transceiver for high speed chip-to-chip communications comprising a receiver circuit and a driver circuit, wherein the driver circuit comprises current source means comprising a dynamically controlled biasing network for generating a control voltage Vc from an input signal whereby the low value of the output current is set near zero and the high value of the output current is independent of the voltage swing of the input signal.

Thus, the driver can drive an external 25 Ω terminated to a voltage ranging from 2V to 5V, and an external reference voltage is not required.

Beneficially, the current source means comprises a bipolar transistor Q3 and Resistance Rs and the dynamically controlled biasing network provides a control voltage Vc for biasing the base of a bipolar transistor Q3 of the current source means.

The dynamically controlled biasing network comprises: a $V_{BE}$ multiplier comprising a first bipolar transistor Q1, and first and second resistors, R and zR, where z is the multiplication factor, wherein z is selected to provide a near zero tail current.

Advantageously, another BJT (Q4) is added, which is much smaller than Q3, the emitters of Q3 and Q4 being coupled together, the collector of Q4 being coupled to the supply voltage, and the base of Q4 being coupled to another reference voltage. The additional elements assist in turning on and off the transistor Q3 more rapidly, thereby increasing the speed and improving noise margins.

These circuits are conveniently fabricated in submicron, e.g. 0.8 μm, BiCMOS technology, and may be operated using a supply voltage of 3.3V, i.e. a standard voltage for digital ASICs.

According to yet another aspect of the present invention there is provided a BiCMOS transceiver comprising a receiver circuit and a driver circuit, the receiver circuit comprising:

an input buffer comprising an emitter coupled pair of first and second bipolar junction transistors (BJTs), and a source follower stage comprising a plurality of PMOS load devices, voltage generating means for providing a reference voltage and load control means for generating first and second control voltages for biasing the PMOS load devices whereby the BJT do not saturate; and the driver circuit comprising a current source means having a dynamically controlled biasing network.

Using a supply voltage of 3.3V the transceiver can drive and receive low voltage swing signals with termination voltages ranging from 5V down to 2V without using an external reference voltages. Thus the transceiver is capable of accepting all commonly used signal levels of BiCMOS, ECL and CML circuits thus providing a "universal" transceiver for Gigahertz operation. Advantageously, on-chip power consumption is much lower than that of existing CML/ECL transceivers with comparable speed.

A further aspect of the present invention provides a BiCMOS integrated circuit comprising a receiver circuit for a transceiver for high speed chip-to-chip communications, the receiver circuit comprising: the receiver circuit comprises: an input buffer (UIB); means for generating a reference voltage ($V_{ref}$); and load control means for generating first and second control voltages V1 and V2; the UIB comprising an emitter coupled differential pair of first and second bipolar junction transistors (BJTs) coupled to a source follower stage comprising a plurality of pairs of PMOS transistors, the PMOS transistors providing a load means; an input signal means and the reference voltage $V_{ref}$ generating means being coupled respectively to the bases of the first and second of BJTS; the load control means being coupled to the gates of the PMOS transistors, first and second control voltages V1 and V2 for biasing corresponding pairs of gates of the PMOS transistor pairs of the load means; and Correspondingly, there is provided a BiCMOS integrated circuit comprising a driver circuit for a transceiver for high speed chip-to-chip communications, the driver circuit comprising: current source means comprising a dynamically controlled biasing network for generating a control voltage Vc from an input signal whereby the low value of the output current is near zero and the high value of the output current is independent of the voltage swing of the input signal.

Thus the driver and receiver may be used in conjunction with other driver and receivers of the same or different types because both the universal receiver and the universal driver are compatible with a wide range of high speed signals from many other common types of drivers and receivers. Thus an integrated circuit integrating a universal driver may be used transmitting signals for chip-to-chip communication with another integrated circuit comprising a different type of receiver circuit. Correspondingly, the universal receiver may receive signals over a wide range of voltages from other integrated circuits comprising drivers of other types. Thus incompatibilities due to different termination/reference voltage requirements and multiple termination and reference voltages, common in conventional systems using transceiver circuits, are avoided or reduced. By elimination or simplification of signal conversion, interface circuitry and multiple reference circuits, the complexity of the system is reduced with consequent overall cost savings.

BRIEF DESCRIPTION OF THE DRAWINGS

Embodiments of the invention will now be described by way of example, with reference to the accompanying drawings, in which.

DESCRIPTION OF THE PREFERRED EMBODIMENTS

Figure 1:
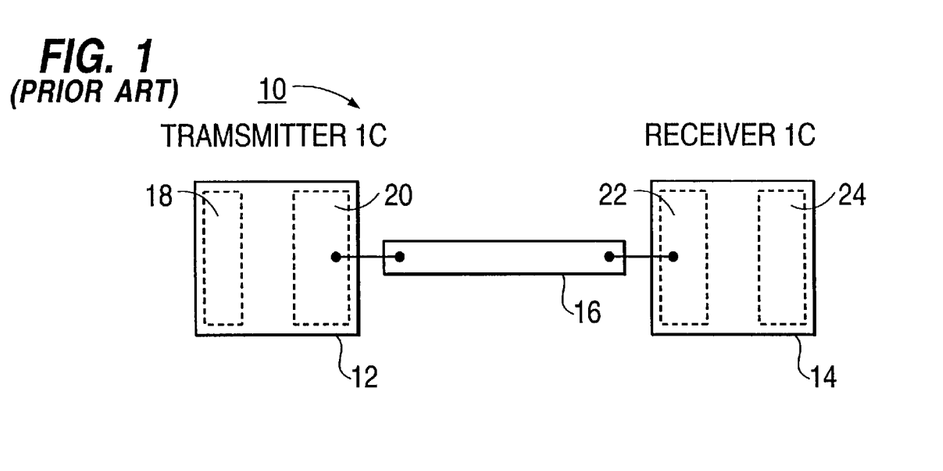
FIG. 1 shows a schematic block diagram of a generalized prior art transceiver comprising a transmitter including a driver, and a receiver for chip-to-chip communications along a transmission line.

A generalized schematic diagram of a transceiver 10 comprising a transmitter 12 and a receiver 14 interconnected by a transmission line 16 for transmitting and receiving digital signals for high speed chip-to-chip communications is shown schematically in FIG. 1. The transmitter 12 forms part of an integrated circuit comprising signal transmitting circuitry 18 and an output driver 20, and the receiver 14 forms part of an integrated circuit comprising an input buffer 22, and signal receiving circuitry 24. The transmitter 12 converts the logic level of an input signal from a signal source, i.e. provided by the signal transmitting circuitry 18, and the transmitted signal is transmitted along the transmission line 16 by the output driver 20. The transmitted signal is received by the input buffer 22 of the receiver 14 for buffering or level shifting to provide a signal compatible with the signal receiving circuitry 24.

Figure 2:
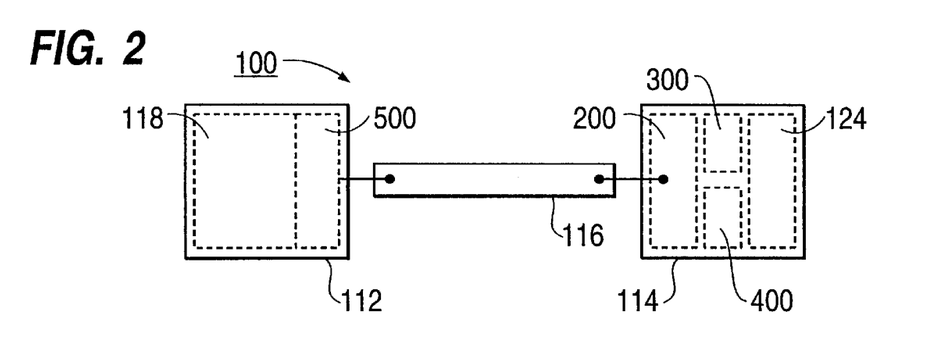
FIG. 2 shows a schematic block diagram of a transceiver comprising a transmitter including a driver, and a receiver for chip-to-chip communications along a transmission line according to a first embodiment of the present invention.

A BiCMOS transceiver 100 according to a first embodiment of the present invention comprises a transmitter and a receiver 114, for sending and receiving digital signals on a transmission line 116 for high speed chip-to-chip communications (FIG. 2). The receiver 114 comprises a universal input buffer 200, voltage reference generator 300 and load control circuit 400, and transmitter 112 comprises an universal output driver 500, which will be described in detail in the following sections. The output driver and input buffer are referred to as universal in the sense that they are designed to be compatible with other circuits operating over the wide range of voltages. In particular, the transmitter 112 and receiver 114 are designed for operation from a 3.3V supply voltage. The receiver can read signals with termination voltages from 1.5 to 5V. The universal driver can drive an external 25 Ω line terminated to a voltage ranging from 2V to 5V is described in the following section. specified above. For both the driver and receiver circuits there is no need for an external reference voltage. The only restriction on the signals is that they swing from $V_T$ to $V_T$-$V_s$ (i.e. they are not level shifted). $V_s$ was assumed to be between 0.8 and 1.0V.

Receiver

Figure 4:
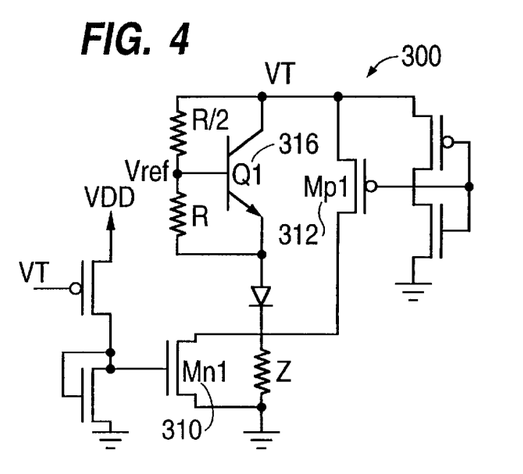
FIGS. 4 and 5 show circuit schematics of reference circuits comprising a reference voltage $V_{ref}$ generator (FIG. 4) and a load control circuit (FIG. 5) according to a first embodiment of the invention.
Figure 5:
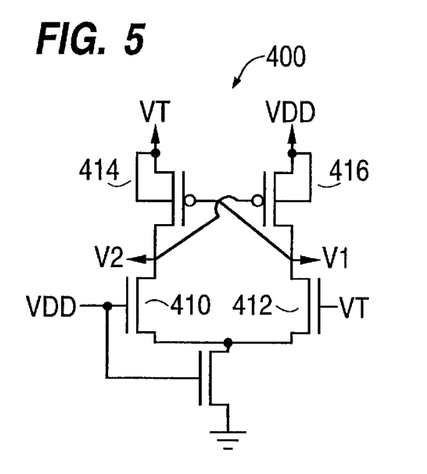

As shown schematically in FIG. 2, the receiver 114 according to a first embodiment of the invention comprises 3 sub-circuits: the universal input buffer UIB 200 (FIG. 3), and two reference circuits, the Vref generator 300 (FIG. 4); and the load control circuit 400 (FIG. 5).

The UIB 200 (FIG. 3) comprises an emitter coupled pair of bipolar junction transistors (BJT) 212 and 214, followed by a source follower stage 216. The four PMOS devices M1, M2, M3 and M4 (218,220,222,and 224) serve as loads for the emitter coupled BJTs 212 and 214. An input signal $V_{in}$ and a reference voltage $V_{ref}$ are applied respectively to the base of BJT 212 and the base of BJT 214. The value of the reference voltage $V_{ref}$ is held by the $V_{ref}$ generator 300 (FIG. 4) at about −0.45V below the termination voltage VT, assuming a signal voltage swing of 0.8 to 1.0V.

The PMOS load devices 218,220 222 and 224 are controlled by the two biasing voltages V1 and V2, which are generated by the load control circuit 400 (FIG. 5).

The load control circuit 400 shows FIG. 5 generates the two control voltages V1 and V2 for biasing the PMOS load devices 218,220,222 and 224 such that the input BJT pair never saturates. For a termination voltage VT less than VDD (3.3V), M1 (218) and M4 (222) will be off, and M2 (220) and M3 (224) will be on and act as loads for the differential pair 212 and 214. Similarly, when VT is greater than VDD, M2 (220) and M3 (224) will be off and M1 (218) and M4 (222) will be on.

Figure 3:
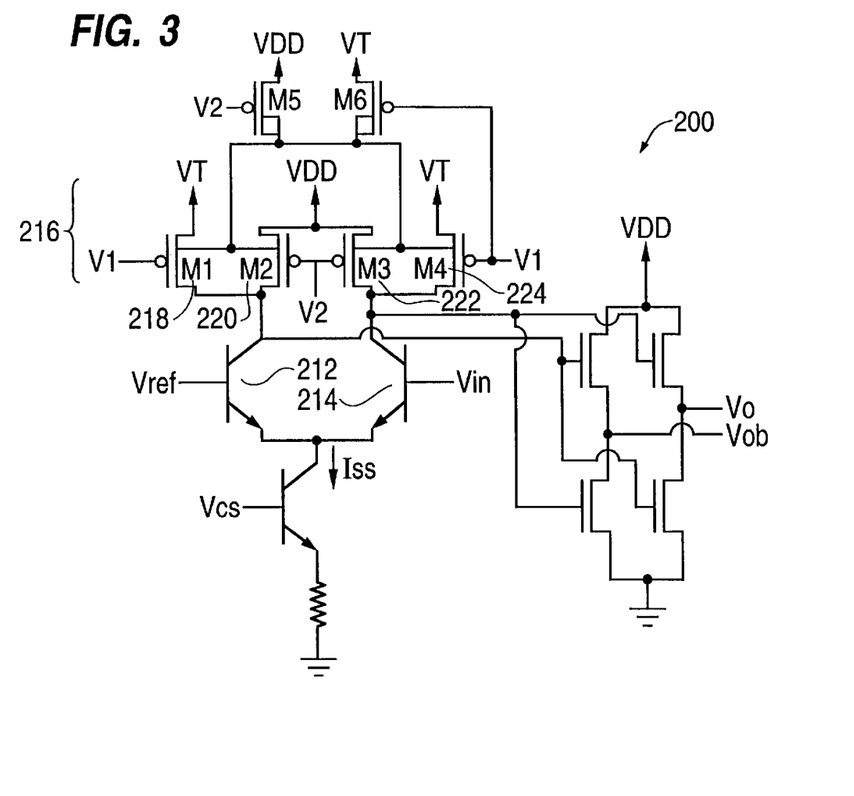
FIG. 3 shows a circuit schematic of a part of a receiver comprising a universal input buffer (UIB) according to a first embodiment of the present invention.

Two additional PMOS transistors M5 (226) and M6 (228) ensure that the N wells of all the PMOS devices, M1–M4 are connected to the highest voltage between VT and VDD. A source follower stage was used, instead of an emitter follower, to avoid saturation problems when VT is larger than VDD. While a source follower stage reduces the speed slightly, it ensures that the differential output signal will not saturate the driven gate.

The $V_{ref}$ generator 300 (FIG. 4) produces a stable reference voltage $V_{ref}$ over a wide range of temperatures and for a range of VT from 1.5 to 5V. NMOSFET Mn1 (310) in FIG. 2 is ON only for VT less than 2.5V. PMOSFET Mp1 (312) and the diode 314 are used for temperature compensation. PMOSFET Mp1 312 is biased in such a way that its drain current will increase linearly with VT. This will keep the current through the BJT Q1 (316) in the VBE multiplier circuit constant, and hence $V_{ref}$ will always remain constant with respect to VT (i.e. $V_{ref}$=VT −0.45V).

As the temperature increases, the drain current of MOSFET 312 Mp1 decreases and hence the emitter current of Q1 316 will increase and compensate the decrease in VBE that occurs as the temperature increases. The reverse happens when the temperature decreases.

Figure 6:
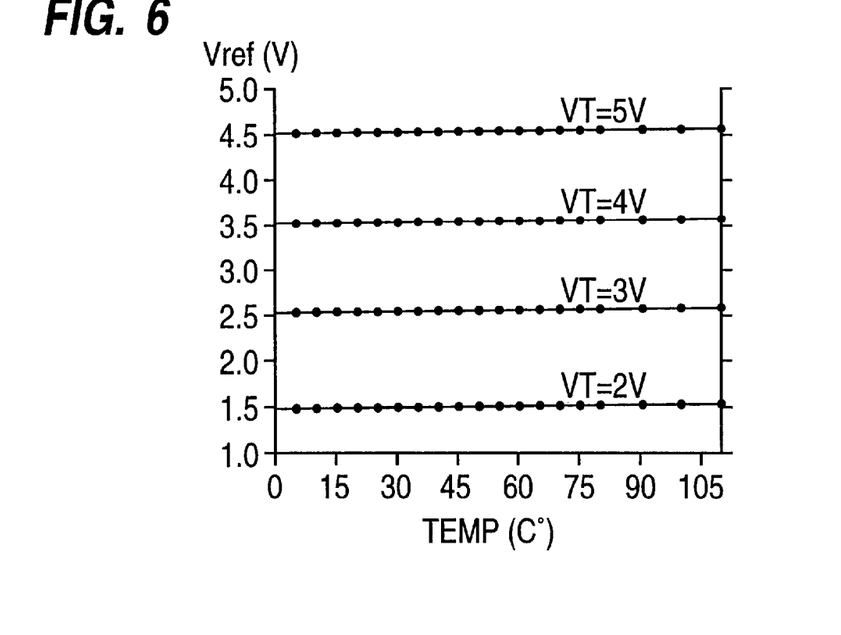
FIG. 6 shows the measured output of the $V_{ref}$ generator vs. temperature for several termination voltages.

FIG. 6 shows the stability of the measured output of the $V_{ref}$ generator over a wide range of temperature for several termination voltages. The maximum change in $V_{ref}$ over the whole temperature range shown for all values of termination voltages was 51 mV, or 5% of the voltage swing.

The load control circuit 400 (FIG. 5) comprises a simple source coupled NMOS transistor pair 410 and 412 with cross-coupled PMOS loads 414 and 416, for generating control voltages V1 and V2.

This arrangement of the input and load MOS devices provides that when VT is less than VDD, V1 will be HIGH and close to VDD (Vdd−V1 would be less than the PMOS threshold voltage $V_{tp}$) and V2 will be LOW. When Vt is greater than VDD, V2 will be HIGH and close to VT (VT−V2<Vtp) and V1 will be LOW. So for VT<VDD, M1 and M4 in the UIB are off, and M2 and M3 are on. Also M5 will be on and the N wells will be connected to VDD.

If VT exceeds VDD, M1 and M4 will be turned on, M1 and M4 will be turned off, and the N wells will be connected to VT.

Figure 7:
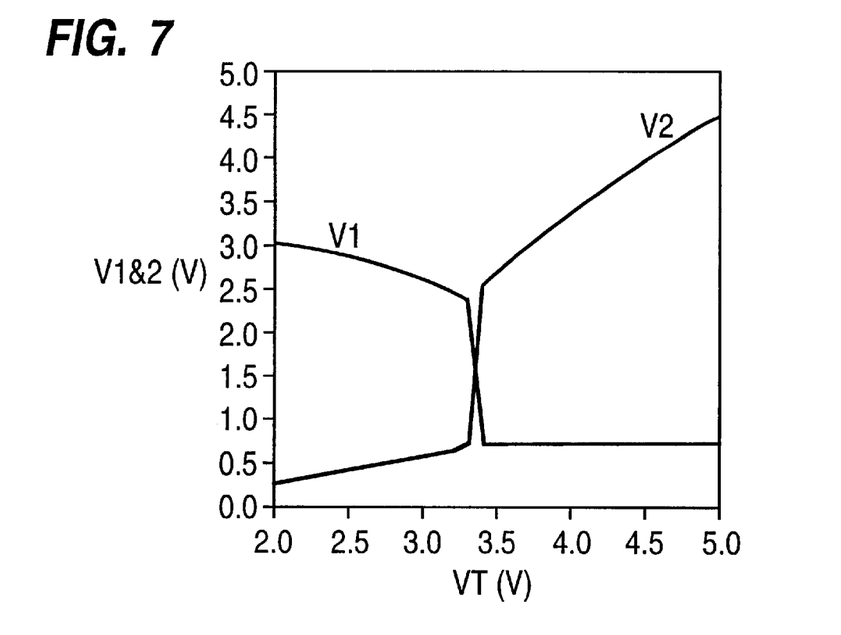
FIG. 7 shows the outputs of the load control circuit vs. VT.

As VT increases further, V2 keeps increasing such that M2, M3 and M5 remain off. This ensures the correct operation of the UIB. No current will flow between VT and VDD in any circumstances. The outputs of V1 and V2 versus VT are shown in FIG. 7 during correct operation.

The load control circuit was found to be very stable over the temperature range. The maximum change in V1 and V2 over the whole temperature range for any value of VT was found to be less than 10 mV.

Figure 8:
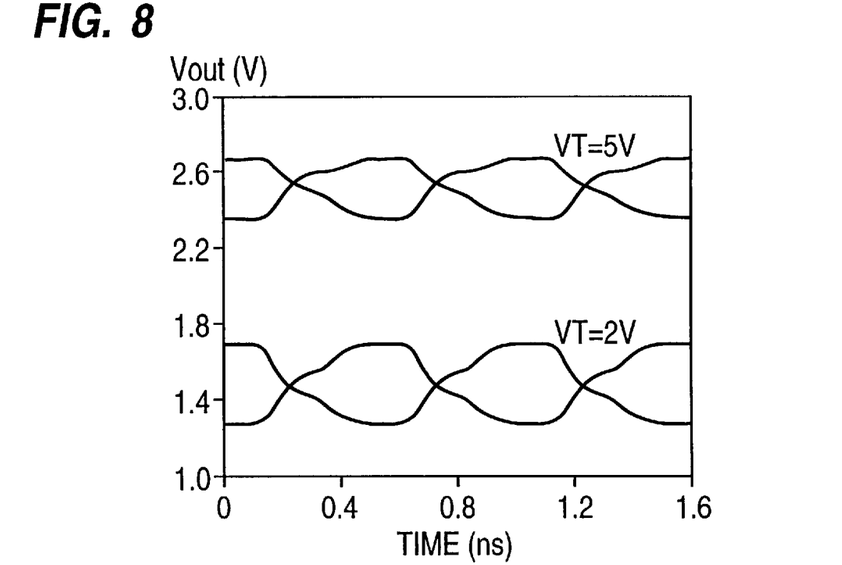
FIG. 8 shows the simulated UIB outputs for the two termination voltages at 1GHz and a fanout of one (ECL gate at the output)

The outputs of the UIB are shown in FIG. 8 for two values of VT (i.e. 2V and 5V) an input frequency of 1 GHz and an ECL gate as a fan out. The value of the tail current of the UIB was 1mA, and the total power of the receiver for a 3.3V termination voltage, including that of the biasing circuits at 1 GHz was 17 mW.

Figure 9:
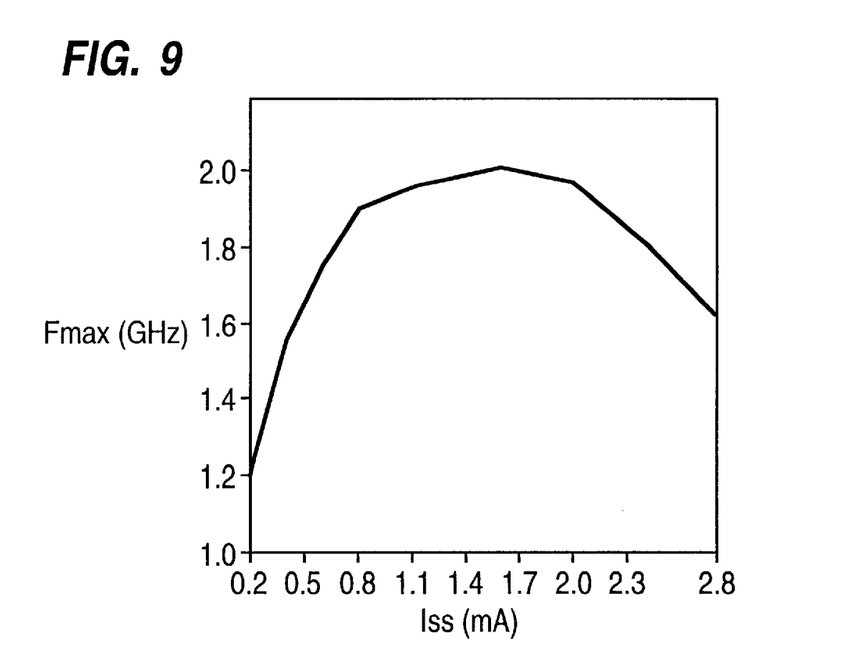
FIG. 9 shows the maximum frequency of operation Fmax of the UIB vs. the tail current Iss.

The maximum frequency of operation Fmax, (i.e. defined here as the frequency at which the output swing of the UIB becomes less than 250 mV) of the UIB versus the value of the tail current is shown in FIG. 9.

In simulations, the sizes of the load PMOS devices M1 to M4 were proportionally increased with the tail current to keep the output voltage swing of the UIB constant. FIG. 9 shows that there is an optimum value of the tail current that yields a maximum speed.

Figure 15:
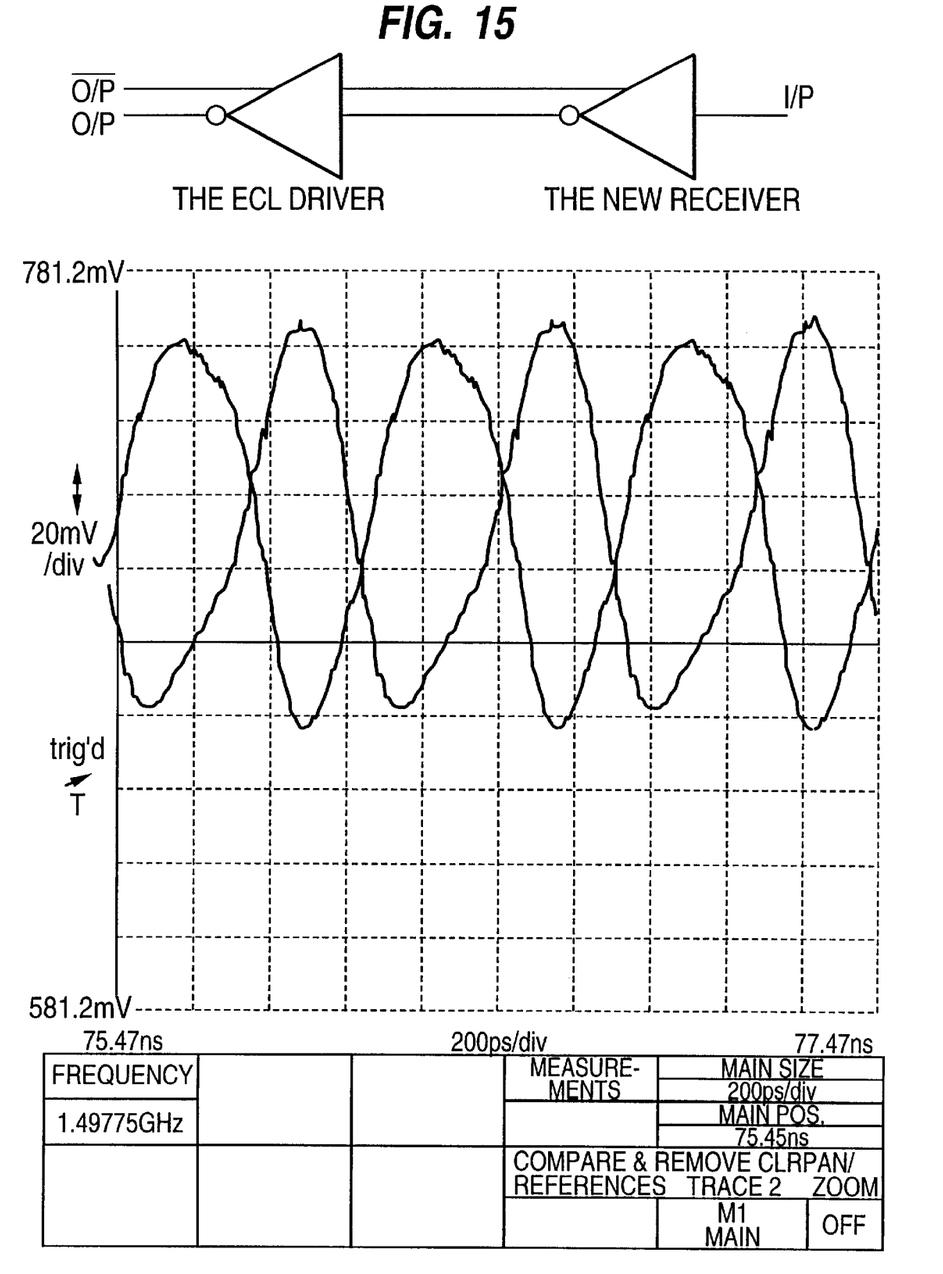
FIG. 15 shows the measured output waveforms of the receiver test structure at 1.5 GHz with 2V input signal termination and 20 dB attenuation at the input of the sampling scope.

Experimental results showing the measured output waveforms of an ECL driver being driven by the receiver at 1.5 GHz (FIG. 15) showing the ability to switch the ECL driver and operate at this frequency. The input signal was terminated to 2V and the value of the tail current of the UIB used was 1 mA.

The measurements showed that the receiver successfully read signals with termination voltages ranging from 1.5 to 5V and frequencies exceeding 1.5 GHz.

Output Driver

Figure 10:
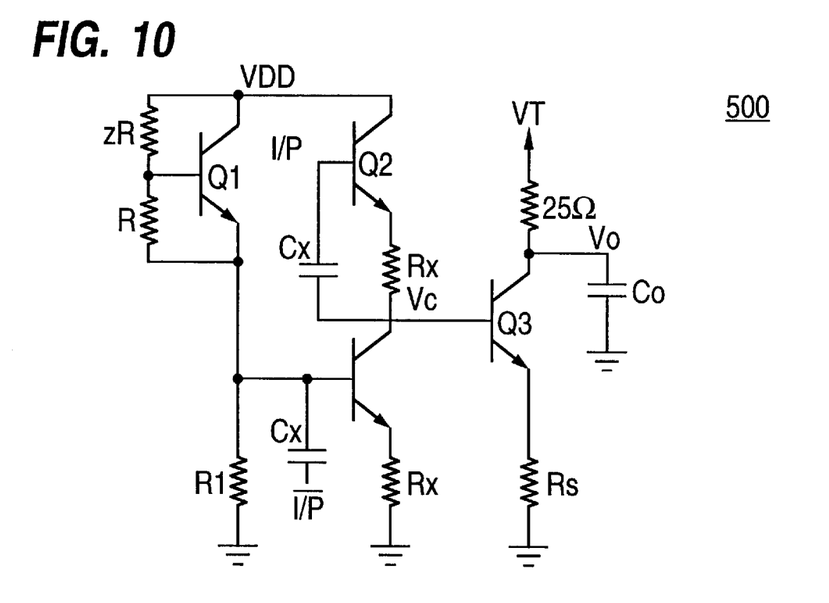
FIG. 10 shows a circuit schematic comprising a universal output driver (UOD 1) according to a first embodiment.
Figure 11:
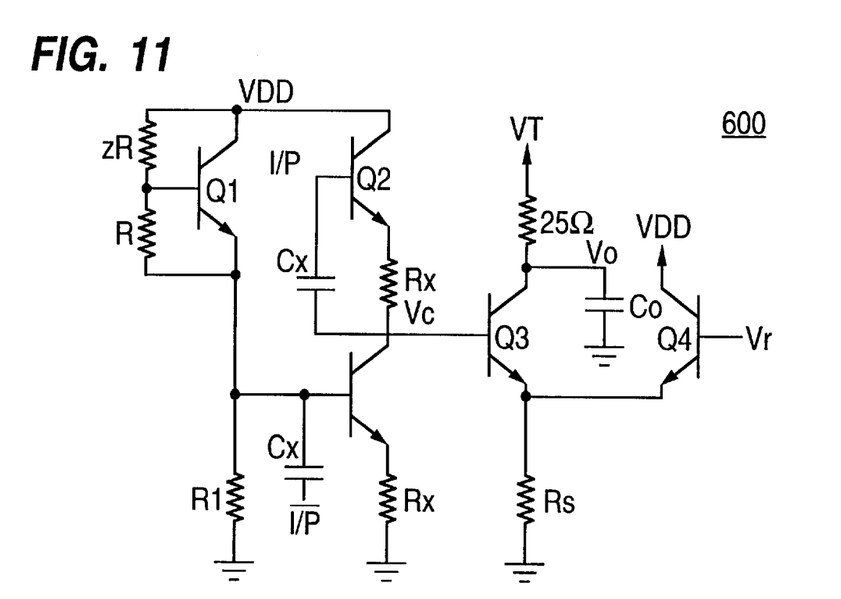
FIG. 11 shows a universal output driver (UOD 2) according to a second embodiment.

An output driver 500 according to a first embodiment of the present invention, UOD1, is shown in FIG. 10 and an output driver 500 according to a second embodiment of the present invention, UOD2, is shown in FIG. 11.

As mentioned above, conventionally, a CML driver is used when lower power is required. The tail current value is determined by the value of the termination resistance and the required output voltage swing. Hence for a 50 Ω termination and a 0.8V swing, the value of the tail current has to be set around 16 mA. This not only limits the speed of the driver but also wastes power. When the output is high and the tail current is in the other branch of the current switch, assuming a single ended output, a high current is not required for operation of the circuit.

Figure 16:
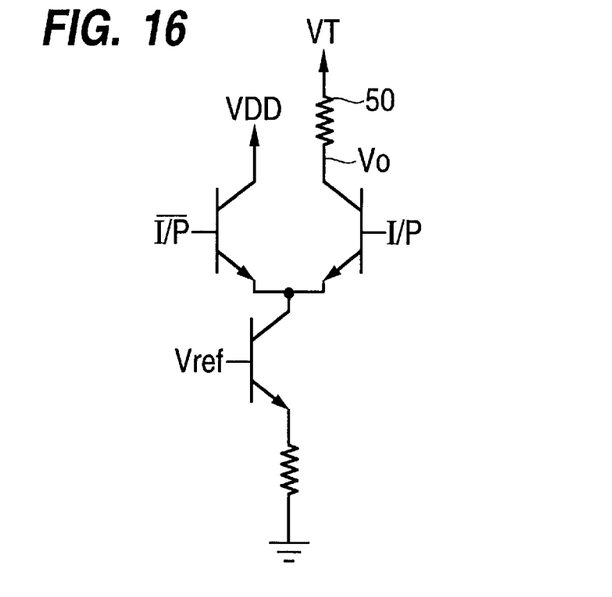
FIG. 16 shows a prior art conventional CML driver comprising a conventional current source.
Figure 17:
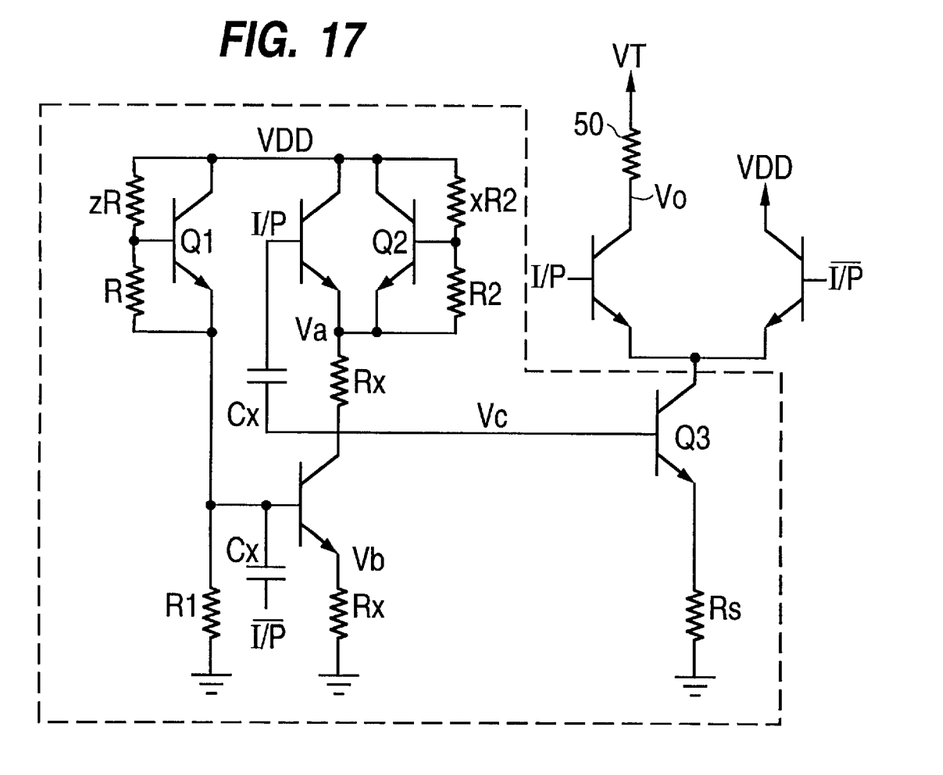
FIG. 17 shows a CML driver having an improved current source according to an embodiment of the present invention.

An improved current source, which includes a dynamically controlled biasing network and overcomes these shortcomings is shown in FIG. 17, with the conventionally used current source shown for comparison in FIG. 16. The current source developed for the output drivers according to the first and second embodiments were developed from the improved current source of FIG. 17, and thus the latter circuit will be described in detail first.

The improved current source works as follows: voltage $V_c$ which in conjunction with resistor $R_s$ determines the value of the tail current is equal to the difference between the voltages at $V_a$ and $V_b$. When the input I/P is high $V_c$ is given by:

$$V_{chigh} = z \cdot V_{BE}.$$

where z is the multiplication factor of the $V_{BE}$ multiplier which comprises Q1 and the two resistors R and zR (FIG. 17). z is adjusted such that $V_c$ is about 1.2 to 1.3V (i.e. z is from about 1.5 to 1.8) and Rz is adjusted such that the high value of the current is around 16 mA. When I/P is low, $V_c$ becomes:

$$V_{clow} = (z-x+1) \cdot V_{BE}$$

where x is the multiplication factor of the $V_{BE}$ multiplier which comprises Q2 and the two resistors R2 and xR2 (FIG. 17) and is between 1.2 to 1.3. Also, it is assumed that the input voltage swing $V_s$ is larger than $\{(x-1) \cdot V_{BE}\}$ such that the low value of the tail current which is determined by the value of $V_c$ in equation above is independently of the voltage swing.

The low value of the tail current constitutes a trade-off between power and speed. The smaller this value, the lower the power is, and the longer the time it takes to boost the current to the high value and switch the circuit. The capacitances $C_x$ are used to enhance the speed and resolve to some degree, the trade-off just described. They do not affect the DC characteristics. The biasing network boosts the tail current during the pull down transition. The driver with the dynamic active pull down current source circuit consumes 40% less power than that of a CML driver with the conventional current sourcing circuit. Also for typical operating conditions, e.g. burst modes, the DCCP circuit saves idle power as compared to the conventional current source circuit. DCCP may be used similarly to reduce the power of an ECL driver by reducing the power consumption in the current switch. Application of this technique to a current source for the output drivers according to embodiments of the present invention will now be described.

An output driver 500 according to a first embodiment of the present invention, UOD1, is shown in FIG. 10. Comparing this circuit schematic with that of the dynamically controlled charge pumped (DCCP) current source circuit described above with reference to FIG. 17, it will be seen that UOD1 is similar in many respects, and results from a modification of the circuit so that the low value of the tail current becomes zero. This is achieved by removing Q2, R2 and xR2 from the circuit in FIG. 17, so that the following condition is imposed by the design:

$$1 < z \leq 1 + V_S/V_{BE}$$

where Vs is the voltage swing of the input signal. This requirement sets the output current LOW value to zero. When I/P is LOW, Vc would be $\leq V_{BE}$. When I/P is HIGH $$V_c\text{high} = zV_{BE} + V_S.$$

($V_c$ would be $\leq V_{be}$ when I/P is low). Thus an approximate value of $V_s$ should be known in advance for proper design of the driver. Note that the HIGH value of the output current, and consequently the output swing, is independent of the exact value of $V_s$.

In practice, the circuit 500 of UOD 1 has two shortcomings. Firstly, the large BJT Q3 is turned on/off solely through the base, hence the base resistance $R_b$ makes the turn on/off slower than the combined base/emitter turn-on/off, as in CML/ECL circuits described above. Secondly, the LOW value of the output current might not be exactly zero as intended in the design. It may reach a few hundreds of μA due to tolerances of resistors in the biasing network, which would slightly reduce noise margins by reducing the value of the output high value $V_OH$.

A universal output driver 600 according to a second embodiment of the present invention UOD2 is shown in FIG. 11. The circuit is similar to the circuit 500 of FIG. 10 UOD1, with the addition of another BJT, Q4 as shown in FIG. 11. Q4, is much smaller than Q3, and has its base connected to a reference voltage $V_r$. In this circuit, the restriction on the HIGH limit of z is relaxed since the LOW value of $V_c$ ($V_c$ low) does not have to be less than $V_{BE}$. The high value of $V_c$ is still equal to $zV_{BE}$.

When the input I/P goes LOW, the tail current is steered away from Q3 to Q4. The LOW value of the tail current however is much smaller than the HIGH value because 1) $V_r$ is set to a value less than the HIGH value of $V_c$; and 2) $V_{BE}$ of Q4 is larger than that of Q3.

Hence, the voltage across $R_s$ will be much smaller when I/P is low. When I/P becomes HIGH, the LOW tail current is steered away from Q4 to Q3, and helps turning-on Q3.

Also, since $V_c$ low can be made greater than that of the UOD1, without affecting the $V_OH$ and the noise margins, the voltage swing of $V_c$ may be made smaller, and hence the circuit operates faster.

The advantages of the driver of the second embodiment UOD2 relative to the UOD 1 is obtained with a slight increases in power consumption and area.

Figure 12:
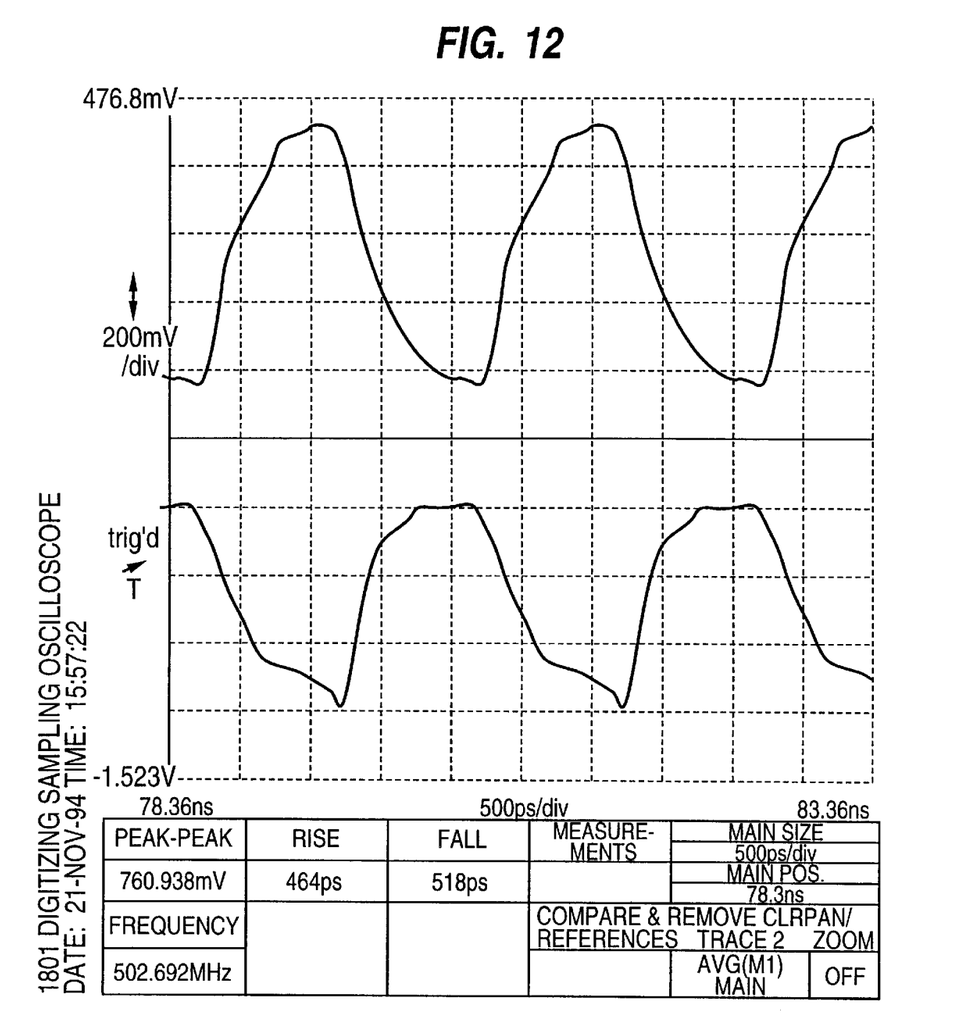
FIG. 12 shows the measured output waveforms of the two drivers at 500 MHz and 5V termination: The output of UOD1 is the lower trace, and of UOD2 is the upper trace.
Figure 13:
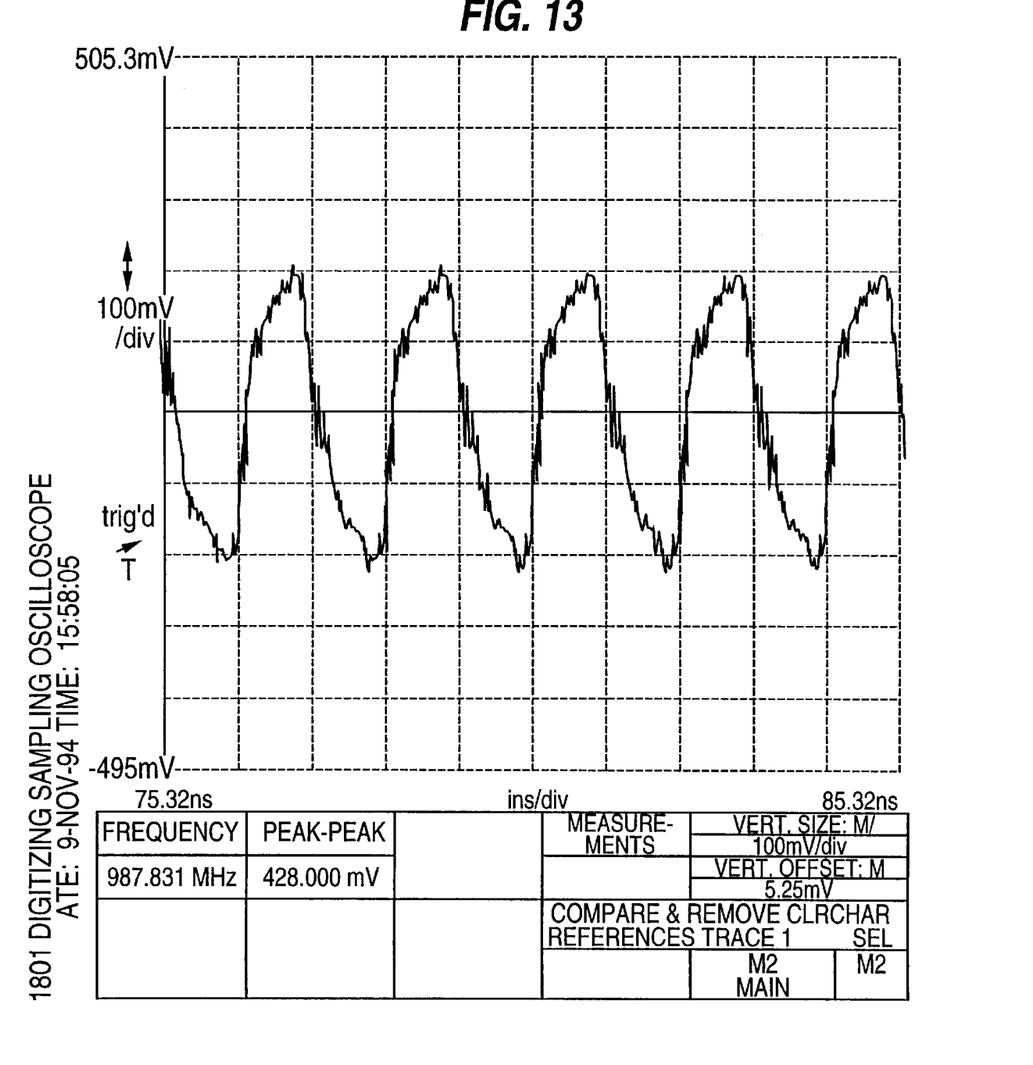
FIG. 13 shows the measured output waveforms of the output drivers of the first and second embodiments operating with an input signal of 500 MHz at a VT of 5V.

The measured outputs of the drivers of the first and second embodiments at 0.5 GHz and a termination voltage of 5V are shown in FIG. 12 for UOD1, circuit 500, in the lower trace, and for UOD2, circuit 600, in the upper trace. The on-chip power requirements at that frequency were 75 mW and 80 mW for the UOD1 and the UOD2, respectively. The measured output of UOD1 at 1 GHz and 5V termination is shown in FIG. 13. The power of a CML driver at the same termination voltage is about 125 mW. For comparison an ECL or pseudo ECL driver would dissipate an even greater power under the same conditions.

Figure 14:
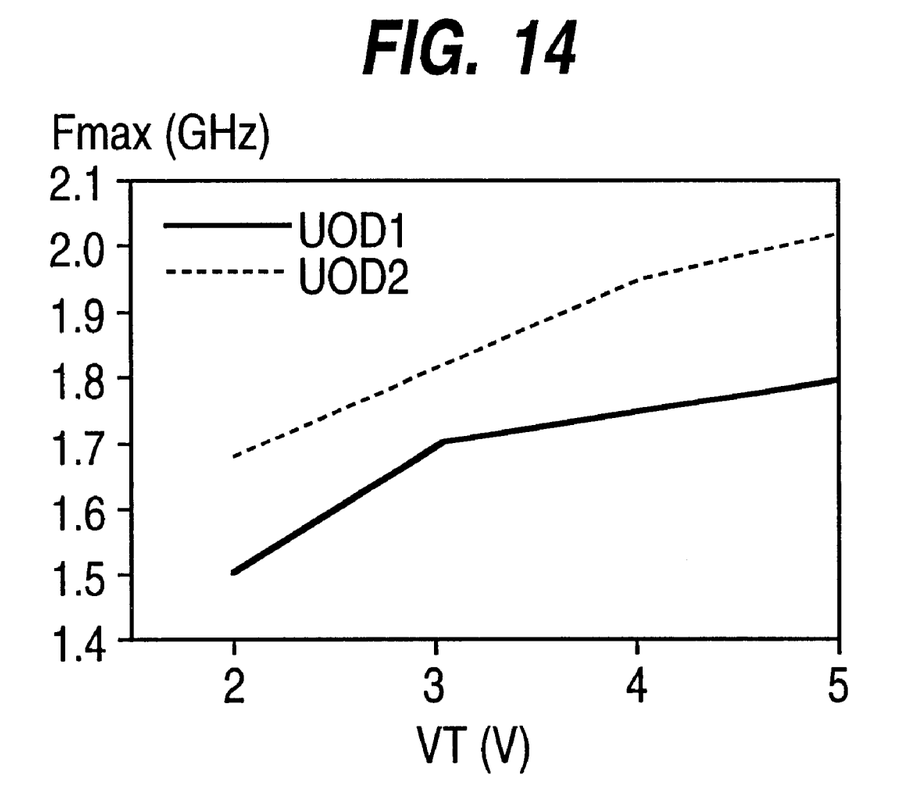
FIG. 14 shows the simulated maximum frequency of operation of the drivers of the first and second embodiments.

For a 2V termination power dissipation of the UOD1 and UOD2 are 25 mW and 29 mW respectively. Simulations showed the superior speed performance of UOD2 over the $V_T$ range. Also, for both drivers, the maximum frequency of operation decreased as VT decreased due to the increase of the collector capacitance and the saturation effects of Q3 (FIG. 14).

Thus a BiCMOS transceiver has been developed which can operate without the need for an off-chip reference voltage. All the required referencing and biasing voltages are generated on chip. Operating with a 3.3 V supply, signals can be received with termination voltages from 1.5 to 5V at frequencies up to and exceeding 1.5 GHz. The driver can operate at frequency above 1 GHz with termination voltage ranging from 2V to 5V. Thus the driver and receiver are operable over a range of termination voltages which is wide enough to be considered universally compatible with various types of integrated circuits. The on-chip power of both receiver and driver are well below that of known CML/ECL transceivers of comparable speeds. Thus the capabilities of BiCMOS technology in implementing diversified high performance smart I/Os and voltage referencing circuits are demonstrated.

Although particular embodiments of the invention have been described in detail, it should be appreciated that numerous modifications, variations and adaptations may be made without departing from the scope of the invention as defined in the claims.

What is claimed is:

1. A transceiver for high speed chip to chip communications over a transmission line with termination voltage $V_T$, comprising a driver circuit and a receiver circuit, wherein the receiver circuit comprises:

an input buffer (UIB);

means for generating a reference voltage ($V_{ref}$);

and load control means for generating first and second control voltages V1 and V2;

the input buffer comprising an emitter coupled differential pair of first and second bipolar junction transistors (BJTs) coupled to a source follower stage comprising a plurality of pairs of PMOS transistors, the PMOS transistors providing a load means;

an input signal means and the reference voltage $V_{ref}$ generating means being coupled respectively to the bases of the first and second of BJTs;

the load control means being coupled to the gates of the PMOS transistors, for providing first and second control voltages V1 and V2 for biasing corresponding pairs of gates of the PMOS transistor pairs of the load means.

2. A transceiver according to claim 1 wherein N wells of the PMOS load means are coupled to the higher of the termination voltage $V_T$ and supply voltage VDD through another pair of PMOS transistors.

3. A transceiver according to claim 1 wherein the means for generating a reference voltage comprises a voltage multiplier circuit comprising a bipolar junction transistor Q1;

a first MOS transistor which is ON only for $V_T$ less than a predetermined value, the first MOS transistor being coupled to the voltage multiplier circuit;

and temperature compensation means comprising a second MOS transistor coupled to a diode, the temperature compensating means being coupled to the voltage multiplier circuit and the first MOS transistor;

means for biasing the second MOS transistor to provide a drain current that increases linearly with $V_T$ thereby maintaining a current through the BJT Q1 in the voltage multiplier circuit constant, whereby $V_{ref}$ will always is independent of $V_T$.

4. A transceiver according to claim 1 for chip-to-chip communication over a transmission line with termination voltage $V_T$ wherein the reference voltage $V_{ref}$ is held by the $V_{ref}$ generating means at about −0.45V below the termination voltage $V_T$.

5. A transceiver according to claim 1 wherein the load control means biases the PMOS load devices such that the input BJT pair never saturates.

6. A transceiver according to claim 1 wherein the load control means comprises a source coupled NMOS transistor pair coupled to cross coupled PMOS transistor loads.

7. A transceiver comprising a receiver circuit and a driver circuit, wherein the driver comprises:

current source means comprising a dynamically controlled biasing network for generating a control voltage $V_c$ from an input signal whereby the low value of an output current is near zero and the high value of an output current is independent of the voltage swing of the input signal, the dynamically controlled biasing network comprising a $V_{BE}$ multiplier having a first bipolar transistor Q1 biased by first resistor R and second resistor zR where z is the multiplication factor, wherein z is selected to provide a near zero tail current.

8. A transceiver according to claim 7 wherein the current source means comprises a bipolar transistor Q3 and an emitter coupled Resistance $R_s$, the dynamically controlled biasing network providing a control voltage $V_c$ for biasing the base of a bipolar transistor Q3 of the current source means.

9. A transceiver according to claim 8 comprising another BJT (Q4), which is much smaller than Q3, emitters of Q3 and Q4 being coupled together, the collector of Q4 being coupled to the supply voltage, the base of Q4 being coupled to another reference voltage.

10. A transceiver comprising a receiver circuit and a driver circuit, the receiver circuit comprising an input buffer comprising an emitter coupled bipolar junction transistor pair, and source follower stage comprising a plurality of PMOS load devices, voltage generating means for providing a reference voltage and load control means for generating first and second control voltages for biasing the PMOS load devices whereby the first and second BJTs do not saturate; and the driver circuit comprising a current source means having a dynamically controlled biasing network.

11. A BiCMOS integrated circuit comprising a receiver circuit for a transceiver for high speed chip-to-chip communications over a transmission line with termination voltage $V_T$, the receiver circuit comprising:

the receiver circuit comprises:

an input buffer (UIB);

means for generating a reference voltage ($V_{ref}$);

and load control means for generating first and second control voltages V1 and V2;

the UIB comprising an emitter coupled differential pair of first and second bipolar junction transistors (BJTs)

coupled to a source follower stage comprising a plurality of pairs of PMOS transistors, the PMOS transistors providing a load means;

an input signal means and the reference voltage $V_{ref}$ generating means being coupled respectively to the bases of the first and second of BJTs;

the load control means being coupled to the gates of the PMOS transistors, first and second control voltages V1 and V2 for biasing corresponding pairs of gates of the PMOS transistor pairs of the load means.

12. A circuit according to claim 11 wherein N wells of the PMOS transistors of the load means are coupled to the higher of the termination voltage $V_T$ and supply voltage $V_{DD}$ through another pair of PMOS transistors.

13. A circuit according to claim 11 wherein the means for generating a reference voltage comprises a voltage multiplier circuit comprising a bipolar junction transistor Q1;

a first MOS transistor which is ON only for $V_T$ less than a predetermined value, the first MOS transistor being coupled to the voltage multiplier circuit;

and temperature compensation means comprising a second MOS transistor coupled to a diode, the temperature compensating means being coupled to the voltage multiplier circuit and the first MOS transistor;

the second MOS transistor being biased in such away that its drain current increases linearly with $V_T$ thereby keeping the current through the BJT Q1 in the voltage multiplier circuit constant, whereby $V_{ref}$ is independent of $V_T$.

14. A circuit according to claim 11 for chip-to-chip communication over a transmission line with termination voltage $V_T$ wherein the reference voltage $V_{ref}$ is held by the $V_{ref}$ generating means at about −0.45V below the termination voltage $V_T$.

15. A circuit according to claim 11 wherein the load control means is operable to provide first and second control voltages for biasing the PMOS load devices whereby the BJT pair do not saturate.

16. A circuit according to claim 11 wherein the load control means comprises a source coupled NMOS transistor pair coupled to cross coupled PMOS transistor loads.

17. An BiMOS integrated circuit comprising a driver circuit for a transceiver for high speed chip-to-chip communications, the driver circuit comprising:

current source means comprising a dynamically controlled biasing network for generating a control voltage $V_c$ from an input signal whereby the low value of an output current is near zero and the high value of an output current is independent of the voltage swing of the input signal, the dynamically controlled biasing network comprising a $V_{BE}$ multiplier having a first bipolar transistor Q1 biased by first resistor R and second resistor zR where z is the multiplication factor, wherein z is selected to provide a near zero tail current.

18. A driver circuit according to claim 17 wherein the current source means comprises a bipolar transistor Q3 and an emitter coupled Resistance $R_s$, the dynamically controlled biasing network providing a control voltage $V_c$ for biasing the base of a bipolar transistor Q3 of the current source means.

19. A driver circuit according to claim 17 comprising another BJT (Q4), which is much smaller than Q3, emitters of Q3 and Q4 being coupled together, the collector of Q4 being coupled to the supply voltage, the base of Q4 being coupled to another reference voltage source.

* * * * *